United States Patent
Gates et al.

(10) Patent No.: US 9,111,761 B2
(45) Date of Patent: Aug. 18, 2015

(54) MULTI COMPONENT DIELECTRIC LAYER

(71) Applicant: INTERNATIONAL BUSINESS MACHINES CORPORATION, Armonk, NY (US)

(72) Inventors: Stephen M. Gates, Ossining, NY (US); Alfred Grill, White Plains, NY (US); Son V. Nguyen, Schenectady, NY (US); Satyanarayana V. Nitta, Poughquag, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 317 days.

(21) Appl. No.: 13/691,129

(22) Filed: Nov. 30, 2012

(65) Prior Publication Data

US 2013/0087923 A1   Apr. 11, 2013

Related U.S. Application Data

(62) Division of application No. 12/853,278, filed on Aug. 9, 2010, now Pat. No. 8,357,608.

(51) Int. Cl.
| | |
|---|---|
| *H01L 29/06* | (2006.01) |
| *H01L 21/02* | (2006.01) |
| *H01L 21/768* | (2006.01) |
| *H01L 23/532* | (2006.01) |
| *H01L 23/538* | (2006.01) |

(52) U.S. Cl.
CPC .............. *H01L 29/06* (2013.01); *H01L 21/022* (2013.01); *H01L 21/02126* (2013.01); *H01L 21/02167* (2013.01); *H01L 21/02203* (2013.01); *H01L 21/02211* (2013.01); *H01L 21/02274* (2013.01); *H01L 21/76801* (2013.01); *H01L 21/76832* (2013.01); *H01L 21/76834* (2013.01);

(Continued)

(58) Field of Classification Search
CPC ............ H01L 23/538; H01L 21/76801; H01L 23/53295; H01L 21/02126; H01L 23/528; H01L 21/76805; H01L 21/76807
USPC ......... 438/622–624, 778, 790, 793, 794, 775, 438/758; 257/751–753, 759, E21.576, 257/E21.267, E21.292
See application file for complete search history.

(56) References Cited

U.S. PATENT DOCUMENTS

| | | |
|---|---|---|
| 6,068,884 A | 5/2000 | Rose |
| 6,147,009 A | 11/2000 | Grill |

(Continued)

OTHER PUBLICATIONS

Grill, "Interface engineering for high interfacial strength between SiCOH and porous SiCOH interconnect dielectrics and diffusion caps" JAP 103, 054104 (2008) AIP USA.

(Continued)

*Primary Examiner* — David Vu
(74) *Attorney, Agent, or Firm* — Louis J. Percello; Robert M. Trepp

(57) ABSTRACT

An in-situ process is described incorporating plasma enhanced chemical vapor deposition comprising flowing at least one of a Si, Si+C, B, Si+B, Si═B+C, and B+C containing precursor, and a N containing precursors at first times and removing the N precursor at second times and starting the flow of an oxidant gas and a porogen gas into the chamber. A dielectric layer is described comprising a network having inorganic random three dimensional covalent bonding throughout the network which contains at least one SiCN, SiCNH, SiN, SiNH, BN, BNH, CBN, CBNH, BSiN, BSiNH, SiCBN and SiCBNH as a first component and a low k dielectric as a second component adjacent thereto.

16 Claims, 4 Drawing Sheets

(52) U.S. Cl.
CPC .......... *H01L23/538* (2013.01); *H01L 23/5329* (2013.01); *H01L 23/53295* (2013.01); *H01L 2221/1047* (2013.01); *H01L 2924/0002* (2013.01)

(56) References Cited

U.S. PATENT DOCUMENTS

| | | | |
|---|---|---|---|
| 6,312,793 B1 | 11/2001 | Grill | |
| 6,919,636 B1 * | 7/2005 | Ryan | 257/751 |
| 7,176,121 B2 | 2/2007 | Ohmori | |
| 7,615,482 B2 | 11/2009 | Edelstein | |
| 7,902,064 B1 * | 3/2011 | Chiang et al. | 438/627 |
| 2009/0179306 A1 | 7/2009 | Grill | |

OTHER PUBLICATIONS

Nguyen, "Plasma deposition and development of ultra low k bilayer SiCNx/SiCNy dielectric Cu cap for 32 nm CMOS devices" Proceeding of Electrochemical Society Fall 2009 Meeting, Paper # 2159, Vienna, Austria.

* cited by examiner

MULTI COMPONENT DIELECTRIC LAYER

This application is a divisional application of application Ser. No. 12/853,278 filed Aug. 9, 2010 now U.S. Pat. No. 8,357,608 of which the benefit of the earlier filing date is claimed.

BACKGROUND

The present invention relates to interconnect structures in semiconductor chips, and more specifically, to a dielectric layer or network having inorganic or hybrid inorganic-organic random three dimensional covalent bonding throughout the network and which contains different regions of different chemical compositions such as a cap component adjacent to a low k component within the layer or network.

Thin dielectric layers are used in semiconductor chips to separate and to support the levels of wiring which may be, for example, 10 levels to provide electrical interconnections. Field effect transistors (FETs) are degraded by Cu which is used substantially in the wiring of typical chips. Therefore a barrier to Cu in the wiring is desirable to prevent any Cu from diffusing into the field effect transistors. The same barrier with strong adhesion to Cu also improves the reliability of the wiring levels during chip operation over time. Further, dielectric layers add capacitance C to the wiring which slows down the electrical signals via the RC time constant where R is the resistance of the wiring and C is the capacitance. Porous dielectrics are fabricated with micro pores or porosity to lower the dielectric constant k of the dielectric. Low capacitance wiring requires a dielectric layer with a low or ultra low dielectric constant k. It is well known in the art that porous dielectrics may be used to reduce the wiring capacitance C in the chip wiring levels.

Dielectric layers also must be chemically and mechanically robust to withstand processing temperatures, chemical mechanical polishing, dicing and packaging the semiconductor chip, and to provide strong adhesion to adjacent wiring containing Cu and other dielectric layers. Strong adhesion between layers in the wiring structure is required.

BRIEF SUMMARY OF THE INVENTION

In accordance with the present invention, a method for forming a dielectric structure is described comprising placing a substrate in a chamber for performing one of plasma enhanced chemical vapor deposition (PECVD) and plasma enhanced atomic layer deposition (PEALD), flowing a vapor including a Si, Si=C, B, Si=B, Si=B=C, and B=C containing precursor, a N containing precursor and an inert gas into the chamber, heating the substrate in the chamber in the range from 100° C. to 450° C., initiating a plasma in the chamber to form a first component comprising at least one of SiCN, SiCNH, SiN, SiNH, BN, BNH, CBN, CBNH, BSiN, BSiNH, SiCBN and SiCBNH on the substrate, while maintaining the plasma, reducing the flow of the N-containing precursor to substantially zero while maintaining the flow of at least one of Si, Si=C, B, Si=B, Si=B=C, and B=C containing precursor and the inert gas, and flowing an oxidant gas into the chamber to form a second component adjacent the first component, the second component comprising at least one of SiCOH, p-SiCOH, p-SiCNH, p-BN, p-BNH, p-CBN and p-CBNH, where p before the composition means the material is porous.

The invention further provides a dielectric structure comprising a first component of at least one of SiCN, SiCNH, SiN, SiNH, BN,BNH, CBN, CBNH, BSiN, BSiNH, SiCBN and SiCBNH and a second component adjacent said first component wherein said second component has a dielectric constant k less than 3.2.

The invention further provides a dielectric structure comprising a first component of at least one of SiCN, SiCNH, SiN, SiNH, BN, BNH, CBN, CBNH, BSiN, BSiNH, SiCBN and SiCBNH, a transition region, and a second component wherein the transition region is between the first and second components and wherein the second component has a dielectric constant k less than 3.2.

The invention further provides an interconnect structure comprising at least one wiring level in an integrated circuit chip having conductors in the wiring level and a dielectric comprising a first component of at least one of SiCN, SiCNH, SiN, SiNH, BN, BNH, CBN, CBNH, BSiN, BSiNH, SiCBN and SiCBNH and a second component adjacent the first component, the second component comprising at least one of SiCOH, p-SiCOH, p-SiCNH, p-BN, p-BNH, p-CBN and p-CBNH.

The invention further provides a dielectric structure with a no carbon concentration increase or peak in C between a first and second component.

The invention further provides a dielectric structure with a non abrupt transition region between a first and second component.

The invention further provides a first and second component without a graded adhesion layer in between resulting in a lower capacitance dielectric layer.

BRIEF DESCRIPTION OF THE SEVERAL VIEWS OF THE DRAWINGS

These and other features, objects, and advantages of the present invention will become apparent upon consideration of the following detailed description of the invention when read in conjunction with the drawing in which.

DETAILED DESCRIPTION

Figure 1:
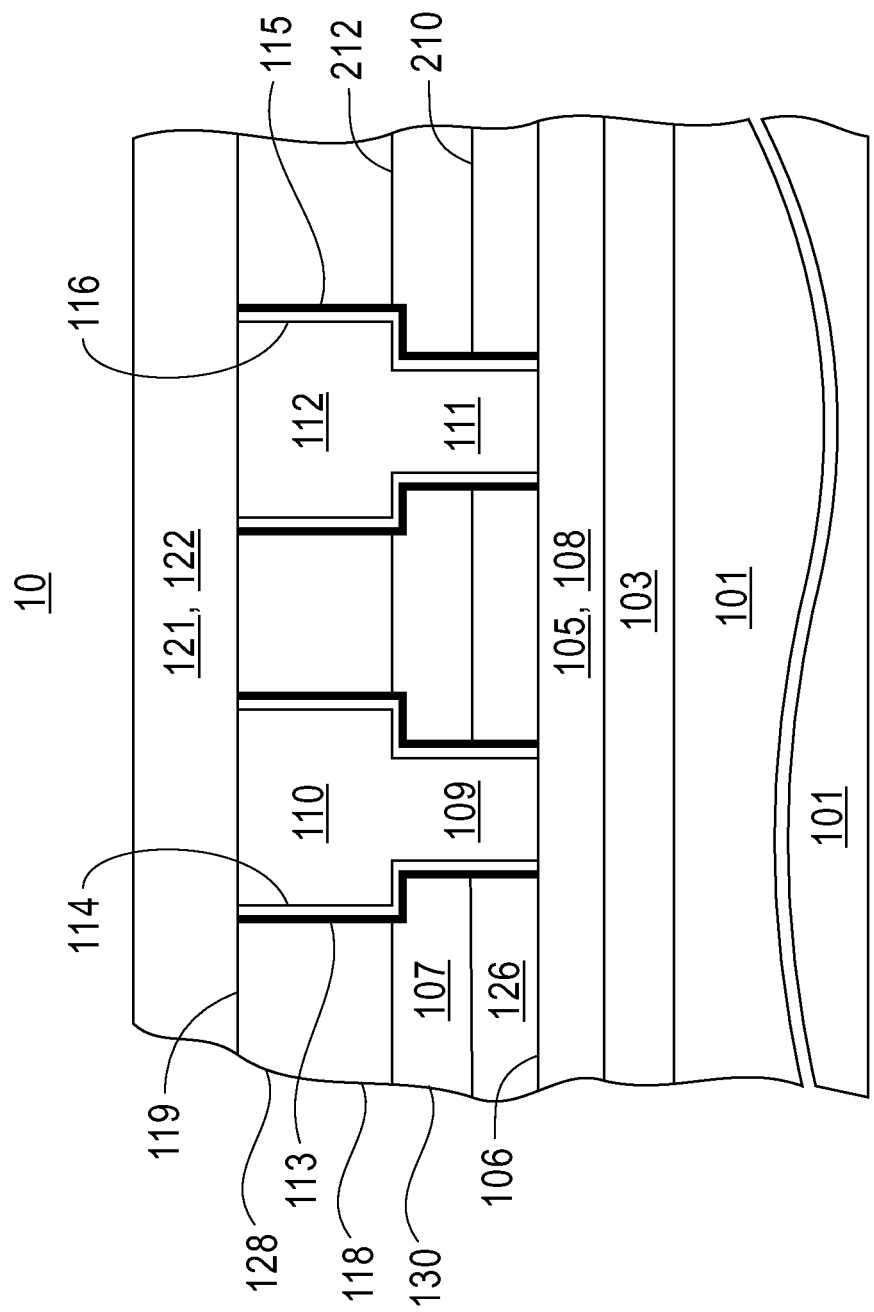
FIG. 1 is a cross-section view of one embodiment of the invention showing an interconnect structure.

Referring now to the drawing, FIG. 1 shows a cross section view of an interconnect structure 10 on a semiconductor chip having a substrate 101, device and device interconnect levels 103, a wiring level 105, a wiring level 107 and a wiring level 121. Substrate 101 may be a bulk semiconductor such as silicon, or a silicon-on-insulator (SOI) substrate. Device and device interconnect levels 103 may comprise for example n and p type FETs, or n and p type bipolar transistors or other transistors or memory structures formed in a semiconductor layer which may be bulk silicon or SOI. The devices may be interconnected for example to form Complementary Metal Oxide Silicon (CMOS) logic, bipolar and CMOS (BiCMOS), FET, and bipolar circuitry. Other kinds of integrated circuit devices or structures may be included within level 103. The wiring levels are interconnected to other wiring levels by way of vertical vias 109 and 111 shown within wiring level 107 which is enlarged in scale to show more details. Wiring level 105 has an upper surface 106 and comprises a Cu wiring line 108 which is shown and intralevel dielectric between wires in wiring level 105 which is not shown.

Wiring level 107 comprises dielectric 118, vias 109 and 111 and wires 110 and 112 which may be for example Cu. Wiring level 107 has an upper surface 119. Vias 109 and 111 and wires 110 and 112 may be formed by a single or dual damascene process well known in the art. Via 109 is surrounded by metal liners 113 and 114 which provide a diffusion barrier to Cu from via 109 and wire 110. Via 111 is surrounded by metal liners 115 and 116 which provide a diffusion barrier to Cu from via 111 and wire 112. Metal liners 113 and 115 provide strong adhesion to dielectric 118. Wiring level 121 comprises a Cu wiring line 122 which is shown and intralevel dielectric between wires which may be dielectric 118 which is not shown. Dielectric 118 provides strong adhesion to wiring level 105 and wiring level 121. The terms "strong adhesion" and "strong adhesion contact" are used herein to mean the two layers or materials being tested show an adhesion strength measured in a 4 point bend adhesion test of greater than 3.5 Joule/meter$^2$ and preferably greater than 4.0 Joule/meter$^2$.

Dielectric 118 comprises a first component 126 which may be, for example, SiCN, SiCNH, SiN, SiNH, BN, BNH, CBN, CBNH, BSiN, BSiNH, SiCBN and SiCBNH which functions as a barrier to Cu and other metals while providing strong adhesion to Cu and at least a second component 128 of low k or ultra low k dielectric which may comprise, for example, SiCOH, p-SiCOH, p-SiCNH, p-BN, p-BNH, p-CBN and p-CBNH compositions where p before the composition indicates the material is porous. First component 126 may be, for example, at least one multilayer of SiN/SiCN, BN/CBN and SiN/BN—CBN. It is understood that when multilayers are described the H containing compositions may be substituted or included. For example, SiNH may replace SiN, SiCNH may replace SiCN; BNH may replace BN; and CBNH may replace CBN.

First component 126 and second component 128 may be formed in-situ in a chamber by plasma enhanced chemical vapor deposition (PECVD) or by plasma enhanced atomic layer deposition (PEALD). Transition region 130 from first component 126 to second component 128 may be formed in-situ in a chamber during PECVD or PEALD where the flow of N containing gases flowing into the chamber forming first component 126 are stopped or reduced over time to zero and the flow of an oxidant gas and a porogen gas or liquid are started or increased over time from zero flow to a final value. In some embodiments, with concurrent stopping and starting of gas flows, transition region 130 may be reduced to zero or be non-existent, or may be present but difficult to detect in the structure. In other embodiments, transition region 130 may be detected. In a preferred embodiment, first component 126, second component 128 and transition region 130 are formed using a continuous plasma so that there does not exist a discrete interface or interfaces between first component 126, second component 128 and transition region 130, but there may be continuous changes in concentration of N, O, C and Si.

Herein, "continuous changes" means that a plot of concentration versus distance from bottom to top (depth) does not have discontinuities or peaks. As is known in the art, a plot of concentration versus distance from bottom to top (depth) may be measured by sputter depth profiling while measuring the elemental composition using for example X-ray photoelectron spectroscopy, secondary ion mass spectroscopy, or other detection methods. As is known in the art, a plot of concentration versus distance from bottom to top (depth) may be also measured in a transmission electron microscope (TEM) using energy loss features that are specific to each element, known as electron energy loss spectroscopy (EELS). In forming transition region 130, the flow of the Si and C containing precursor and the N containing precursor may be adjusted wherein the concentration of C and N decreases and O increases as a function of distance from the first component to the second component.

The chemical composition of first component 126 and second component 128 in dielectric layer 118 is determined by deposition parameters in the chamber such as pressure, flow rate, temperature, plasma power density at the substrate and the precursor gases and inert gases supplied to the chamber. The composition in a transition region 130 between the first component 126 and second components 128 comprises substantially one or more atoms of Si, C, N, O and H and can be controlled to prevent an increased concentration of any one element, for example carbon. Carbon concentration is controlled within the invention by suitable adjustment of the C containing precursor flows and by using an excess of $O_2$ to reduce C when needed. The thickness of first component 126 may be in the range from 5 nm to 100 nm. The thickness of transition region 130 may be non-existent or of a thickness in the range from 0 nm to 100 nm as determined by the time required to go from a first set of precursor gases to a second set of precursor gases as well as the deposition parameters in the chamber enumerated above. The thickness of second component 128 may be in the range from 10 nm to 1000 nm and more preferably in the range from 10 nm to 100 nm. The combined thicknesses of first component 126, second component 128 and transition region 130 may be in the range from 15 nm to 1200 nm and preferably in the range from 15 nm to 300 nm. First component 126, transition region 130 and second component 128 may have one continuous random three dimensional covalently bonded network extending from and spanning the first component 126 and second component 128.

Figure 2:
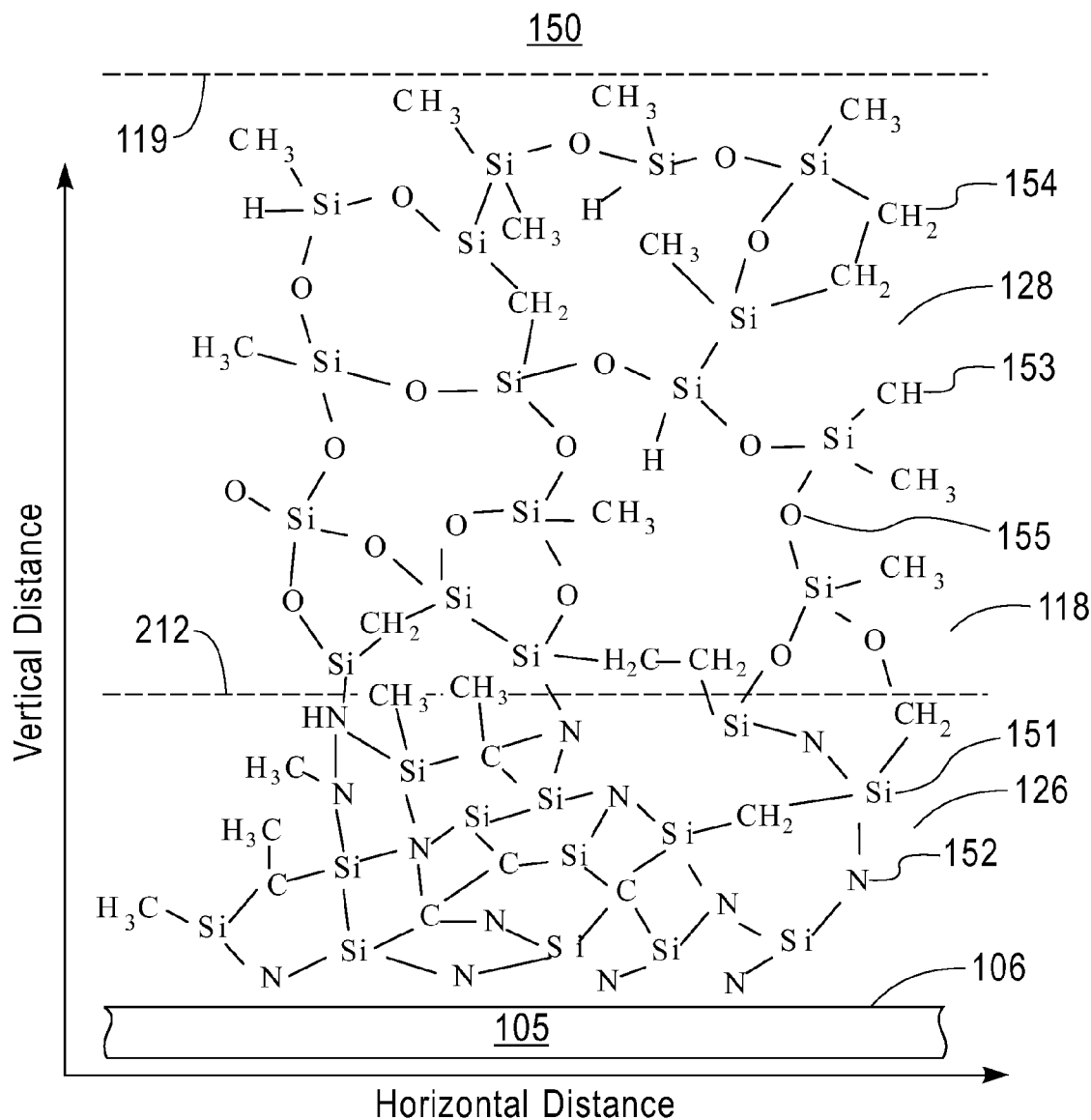
FIG. 2 is a schematic representation of an estimate of a random three dimensional covalently bonded network or structure of one embodiment of the invention.

Referring to FIG. 2, a schematic representation of an estimate of a random three dimensional covalent bonded structure of atoms are shown wherein the atoms form a first component 126 having a first composition comprising Si, C, N or Si, C, N and H and a second component 128 having a second composition comprising Si, C, O and H. In FIG. 2, the ordinate represents vertical distance through dielectric 118 and/or through a wiring level and the abscissa represents horizontal distance along a dielectric 118 and/or along a wiring level. The straight lines between atoms represent covalent bonds. FIG. 2 shows covalent bonds to Si, N, C, H and O atoms. FIG. 2 shows a random three dimensional covalently bonded network 150 where there is no fundamental repeating unit in the network 150. The silicon atoms are shown as "Si" and are labeled 151. The nitrogen atoms in network 150 are shown as "N" and are labeled 152. The carbon atoms in network 150 are represented by "C" and are labeled 153. The hydrogen atoms in network 150 are represented by "H" and are labeled 154. The oxygen atoms in network 150 are represented by "O" and are labeled 155.

As shown in FIG. 2, dielectric 118 has a first component 126 comprising Si, N, C and H atoms which form a random three dimensional covalently bonded structure comprising bonds selected from Si—N, Si—C, Si—CH$_3$, Si—Si, C—N, Si—C—Si, Si—C—C—Si, C—H, N—H and Si—H bonds.

As shown in FIG. 2, dielectric 118 has a second component 128 comprising Si, C, O and H atoms which form a random three dimensional covalently bonded structure comprising bonds selected from Si—O, Si—$CH_3$, C—C, Si—C—Si, Si—C—C—Si, C—H, N—H and Si—H bonds.

In FIG. 2, there is no transition region between first component 126 and second component 128 by concurrently stopping $NH_3$ gas from entering the PECVD or PEALD chamber and starting oxidant and porogen gas flow into the PECVD or PEALD chamber. In some embodiments, a transition region 130 may form and be detected. In other embodiments, a transition region may not form or be difficult or impossible to detect.

Where first component 126 comprises at least one of BN, BNH, CBN, CBNH, BSiN, BSiNH, SiCBN and SiCBNH, covalent bonds of B—N, B—C, B—H, and Si—B may be formed if the respective atoms or ions are present during PECVD or PEALD resulting in a random three dimensional covalently bonded structure.

Where second component 128 comprises at least one of p-BN, p-BNH, p-CBN and p-CBNH, covalent bonds of B—N, B—C and B—H may be formed if the respective atoms or ions are present during PECVD or PEALD resulting in a random three dimensional covalently bonded structure.

Where transition region 130 is present and comprises at least one of BN, BNH, CBN, CBNH, BSiN, BSiNH, SiCBN and SiCBNH then covalent bonds of B—N, B—C, B—H and Si—B may be formed if the respective atoms or ions are present during PECVD or PEALD resulting in a random three dimensional covalently bonded network.

Where transition region 130 is present and comprises at least one of p-BN, p-BNH, p-CBN and p-CBNH then covalent bonds of B—N, B-C and B—H may be formed if the respective atoms or ions are present during PECVD or PEALD resulting in a random three dimensional covalently bonded network.

Figure 3:
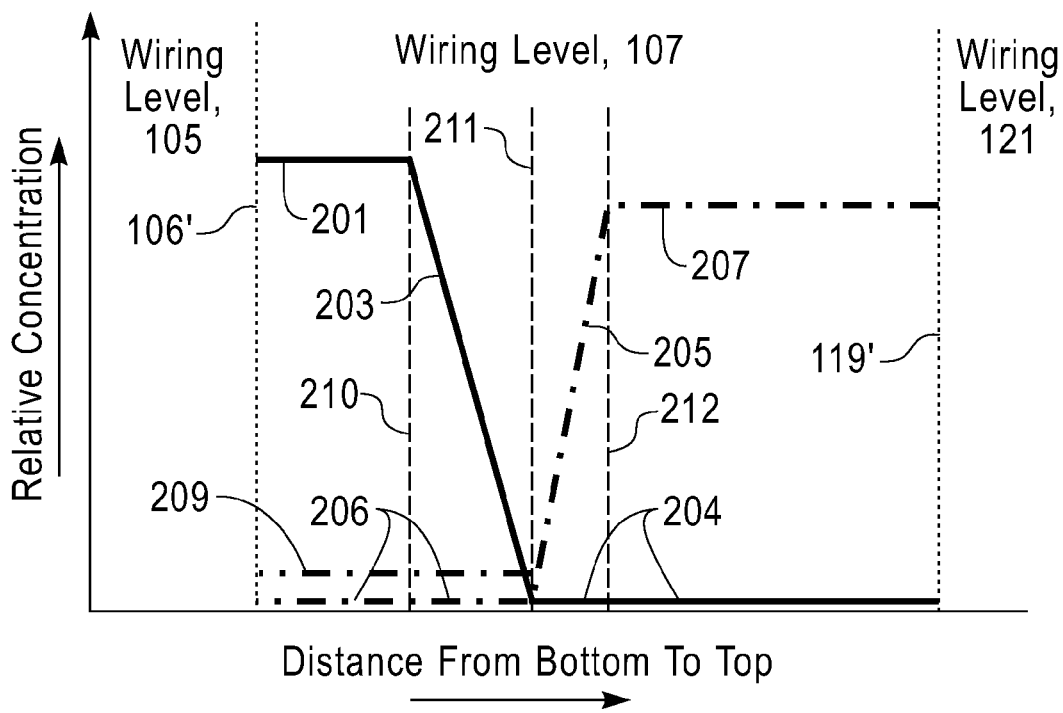
FIG. 3 is a graph showing an estimate of the relative concentration profiles of N and porosity in a dielectric 118 in wiring level 107 shown in FIG. 1.

FIG. 3 is a graph showing an estimate of the relative concentration profiles of N and porosity in dielectric 118 in wiring level 107. In FIG. 3, the ordinate represents relative concentration of N atoms and of porosity and the abscissa represents distance from bottom to top of wiring levels 105, 107, and 121. The upper surface 106 of wiring level 105 is indicated by reference line 106' and the upper surface 119 of wiring level 107 is indicated by reference line 119'. In FIG. 3, first component 126 extends from reference line 106' to reference line 210. Second component 128 extends from reference line 212 to reference line 119'. Transition region 130 extends from reference line 210 to reference line 212 in FIG. 3.

The relative concentration of N in first component 126 in FIG. 1 is shown by curve 201 in FIG. 3 where the relative concentration of N is constant. The relative concentration of N in transition region 130 is shown by curve 203 which decreases to zero or substantially zero at curve 204 from the value of curve 201. The relative concentration of N in second component 128 is shown by curve 204 which is zero or substantially zero.

The relative concentration of porosity (similar to the profile of the porous volume not shown) in first component 126 is shown by curve 206 which is zero. The relative concentration of porosity in transition region 130 is shown by curve 206 and curve 205 which increases to the value of curve 207. With the use of low-k porous dielectrics for first component 126, there will be some non-zero porosity in first component 126 and transition region 130 shown by curve 209 in place of curve 206 in FIG. 3. The relative concentration of porosity in second component 128 is shown by curve 207 which is constant. Reference line 210 indicates the location of the upper surface of first component 126. Reference line 211 indicates the location of the N in transition region 130 going to zero and the location or beginning of porosity in the transition region 130 going from zero to a value. Reference line 212 indicates the location of the lower surface of second component 128.

Figure 4:
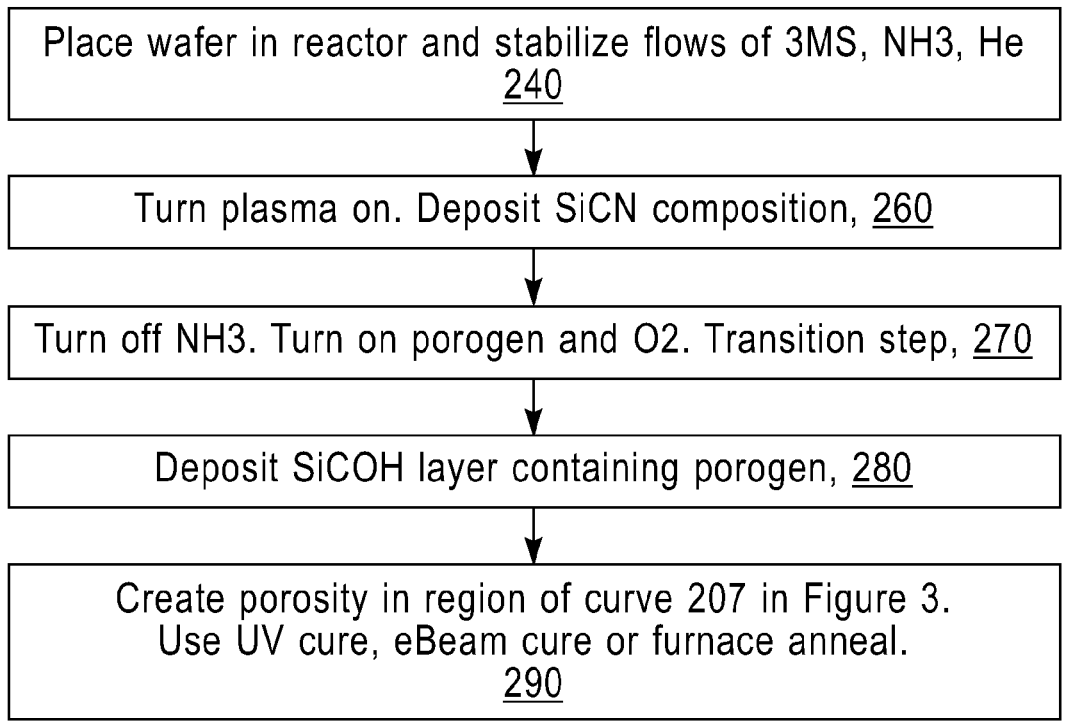
FIG. 4 is a flow chart to illustrate a method for forming a dielectric layer shown in FIGS. 1 and 2.

FIG. 4 is a flow chart to illustrate a method for forming dielectric 118 in wiring level 107 shown in FIG. 1. Referring to box 240, a substrate 101 such as a semiconductor wafer of bulk silicon or SOI having device and interconnect levels 103 and wiring level 105 is placed on a wafer chuck in a Plasma Enhanced Chemical Vapor Deposition (PECVD) process chamber or Plasma Enhanced Atomic Layer Deposition (PEALD) process chamber. The wafer chuck may be heated by a power source to a temperature in the range from 100° C. to 450° C. A mixture of trimethylsilane (3MS) and ammonia ($NH_3$) is flowed into the chamber with He or another inert gas such as $N_2$, and Ar. Other Si, N and C containing precursors may be used.

Where first component 126 comprises at least one of BN and BNH, precursor vapors may be at least one of borane, diborane, liquid borazine ($B_3N_3H_6$), ammonia borane ($NH_3$—$BH_3$), and other gas/liquid/vapor containing B, N and H elements only.

Where first component 126 comprises at least one of CBN and CBNH, precursor vapors may be at least one of BN/BNH precursors and a hydrocarbon such as ethylene, propylene, ethane, and other gas/liquid/vapor with N, N', N" trimethyl borazine, B, B', B" triethynyl borazine. These precursors may be used with or without $NH_3$. Other gas/liquid/vapor precursors containing B, N, C and H elements only may be used.

Where first component 126 comprises at least one of BSiN and BSiNH, precursor vapors may be at least one of borane, diborane, liquid borazine ($B_3N_3H_6$), ammonia borane ($NH_3$—$BH_3$), and other gas/liquid/vapor with B, N and H elements only and a silane based precursor, for example, $SiH_4$, $Si_2H_6$. Additional $NH_3$ and inert gases are an option. Other liquid borazine and silane based gas may be used.

Where first component 126 comprises at least one of SiCBN and SiCBNH, precursor vapors may be at least one of the CBN and CBNH precursors and a silane based precursor ($SiH_4$, $Si_2H_6$, . . . etc.). Additional $NH_3$ or inert gases or hydrocarbon gases are optionally added. Other liquid borazine type precursors may be used, for example N, N', N" trimethyl borazine or B, B', B" triethynyl borazine, with a silane based precursor ($SiH_4$, $Si_2H_6$, etc.) or with an alkylsilane precursor.

Referring to box 260, RF power is applied to the wafer or a gas distribution plate to initiate a plasma in the chamber to form first component 126 of wiring level 107 shown in FIGS. 1 and 2 on the wafer which may be, for example, at least one of SiCN, SiCNH, SiN, SiNH, BN, BNH, CBN, CBNH, BSiN, BSiNH, SiCBN and SiCBNH.

Referring to box 270, while maintaining the plasma as a continuous plasma, the $NH_3$ gas flow is stopped or reduced to zero and flows of two new additional gases are turned on, The gases being an oxidant such as $N_2O$ or $O_2$ and a porogen gas such as bicycloheptadiene (BCHD). A vapor of a liquid precursor may also be used. Within the invention, other porogen precursors and other oxidants may be used, with examples of these known in the art.

Referring to box 280, the gas flows have been stabilized and with the plasma maintained, a second component 128 of, for example, at least one of SiCOH, p-SiCOH, p-SiCNH, p-BN, p-BNH, p-CBN and p-CBNH is formed over the transition region 130 shown in FIG. 1. The gas flows may be adjusted to provide second component 128 with a desired final k value less than 3.2. Suitable precursors for second component 128 comprising B are the same as given with respect to first component 126 that comprises B.

Referring to box 290, the Dielectric on the wafer is exposed to ultraviolet radiation, eBeam and/or thermal treatment to form a porosity in the second component 128 for example, at least one of p-SiCOH, p-SiCNH, p-BNH, p-CBN and p-CBNH.

Figure 5:
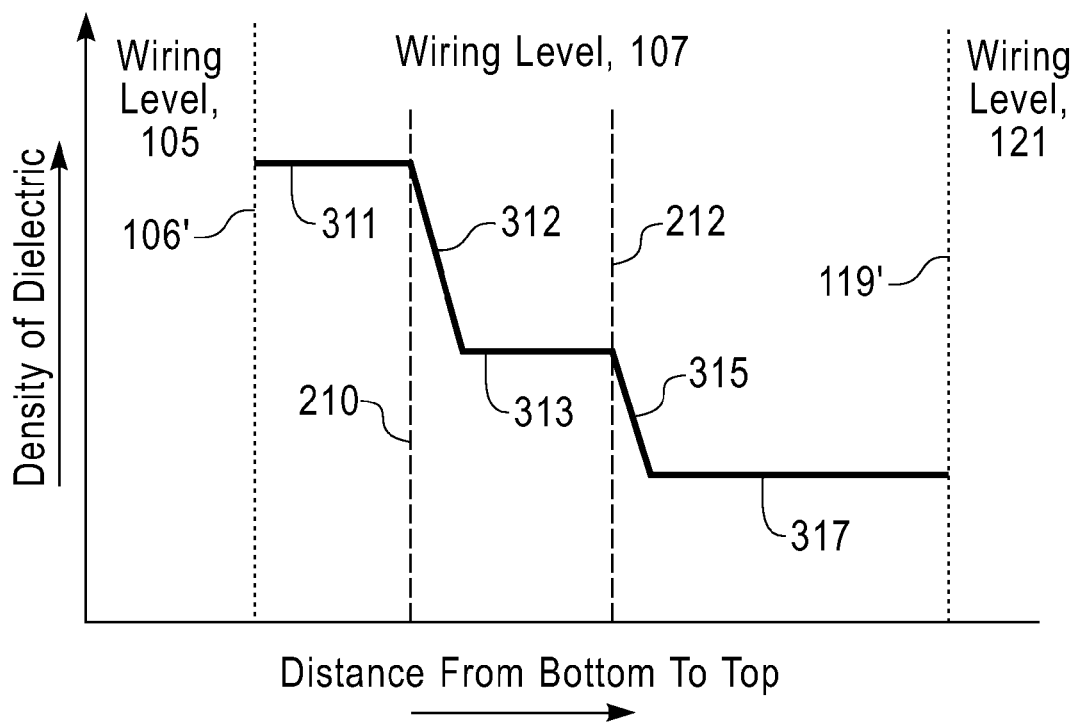
FIG. 5 is a graph showing an estimate of a density profile of a dielectric layer shown in FIG. 1 made by the method of FIG. 4.

FIG. 5 is a graph showing an estimate of the density profile of a dielectric layer of dielectric 118 in wiring level 107 shown in FIG. 1 made by the method shown in FIG. 4, according to one embodiment. In FIG. 5 the ordinate represents density of dielectric and the abscissa represents distance from bottom to top through wiring levels 105, 107 and 121. The upper surface 106 of wiring level 105 is indicated by reference line 106' and the upper surface 119 of wiring level 107 is indicated by reference line 119'.

The density of first component 126 of dielectric 118 after ultraviolet (UV) radiation treatment shown in box 290 of FIG. 4 is shown by curve 311. Reference line 210 indicates the location of upper surface of first component 126 and the beginning of transition region 130. In transition region 130, the density of dielectric 118 decreases as shown by curve 312 to a steady value shown by curve 313.

Reference line 212 indicates the upper surface of transition region 130 and the lower surface of second component 128. The density of second component 128 of dielectric 118 decreased from the lower surface, reference line 212, well into second component 128 shown by curve 315. The density remains constant at a low value from the end of curve 315 to reference line 119' as shown by curve 317.

Figure 6:
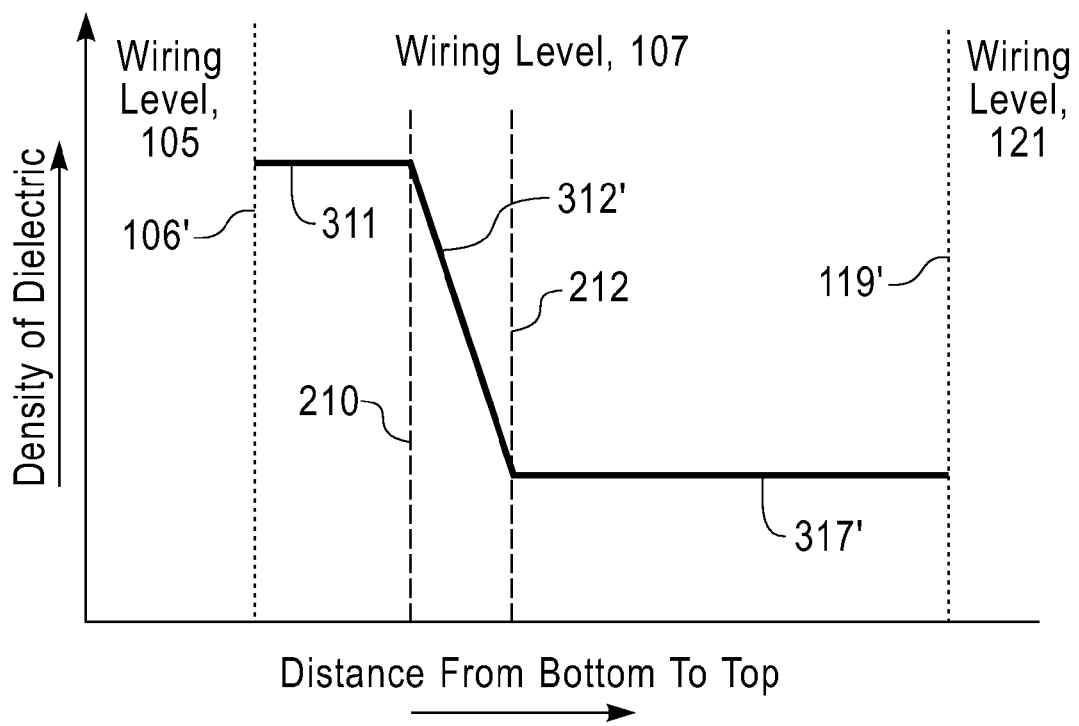
FIG. 6 is a graph showing an estimate of a density profile of a dielectric layer made by the method of FIG. 4.

FIG. 6 is a graph showing an estimate of the density profile of a dielectric layer of dielectric 118 in wiring level 107 made by the method shown in FIG. 4, according to an alternative embodiment. In FIG. 6, the ordinate represents density of dielectric and the abscissa represents distance from bottom to top through wiring levels 105, 107 and 121. The upper surface 106 of wiring level 105 is indicated by reference line 106' and the upper surface 119 of wiring level 107 is indicated by reference line 119'.

The density of first component 126 of dielectric 118 after ultraviolet (UV) radiation treatment shown in box 290 of FIG. 4 is shown by curve 311. Reference line 210 indicates the location of upper surface of first component 126 and the beginning of transition region 130. In transition region 130, the density of dielectric 118 decreases as shown by curve 312' to a constant value shown by curve 317' at reference line 212.

Reference line 212 indicates the upper surface of transition region 130 and the lower surface of second component 128. The density of second component 128 of dielectric 118 remains constant at a low value from the end of curve 312' to reference line 119' as shown by curve 317'.

In FIGS. 1-6, like reference numerals are used for structures or curves corresponding to like structures or curves in an earlier Figure.

Generally, the embodiments described provide a dielectric film that is a random three dimensional covalently bonded network based on Si which contains different regions of different chemical composition. The embodiments have a continuous random three dimensional covalent bonding throughout the network. Being based on Si, the dielectric film may be called "inorganic". Using also the term "organic" to mean based on carbon, the dielectric of this invention may be called a hybrid inorganic-organic dielectric. In each embodiment, there is a region or component of the network comprised of Si, C and N and optionally containing H. It is preferred that this region is in strong adhesive contact with a Cu structure, such as a damascene Cu wiring structure. This first region or component comprises at least one of SiCN, SiCNH, SiN, SiNH, BN, BNH, CBN, CBNH, BSiN, BSiNH, SiCBN and SiCBNH.

In one embodiment, there is a second region or component of the network comprised of Si, O, C and H, called "SiCOH". In some other embodiments, the second region or component may contain free volume or distinct pores that are present to reduce the dielectric constant (k) of the network, and this second region may be porous SiCOH, or "p-SiCOH".

In other embodiments, the first region or component is in contact with a second region that contains free volume or distinct pores, called porous SiCN (p-SiCN), or p-SiCNH.

In a first embodiment, the SiCOH region has some free volume and a k value between 2.6 to 3.2

In a second embodiment, the SiCOH region contains porosity, for example containing 5% to 40% porosity by volume, and a dielectric constant k less than 2.6.

In a third embodiment, the porous SiCNH region has a k value less than 3.2.

In some embodiments, a transition region is detected between the first and second regions. In some embodiments, there is no detectable transition region.

First Method Embodiment

In this example, an inorganic random three dimensional covalently bonded network is deposited on a substrate using a stepwise process. The substrate may be a Si wafer containing transistors, wiring and other electronic structures. The substrate is placed in a reactor (PECVD tool, 300 mm) and the precursor gas and vapor flows are stabilized to reach a desired reactor pressure that may be in the range from 0.1 torr to 100 torr, for example, 5 torr. and more preferably in the range from 3 torr to 10 torr. The wafer chuck temperature is typically set to 350° C., but this temperature may be in the range from 100° C. to 450° C. The starting precursors are trimethylsilane (3MS), ammonia ($NH_3$) and a diluent gas such as He. Other diluent gases such as $N_2$, Ar, and the like may be used. The abbreviation sccm is used to mean standard cubic centimeters per minute, common units of gas mass flow. In this example, the 3MS flow rate is 300 sccm, the NH3 flow rate is 1200 sccm, the He flow rate is 1200 sccm. The 3MS flow rate may be in the range from 10 sccm to 3,000 sccm. The $NH_3$ flow rate may be in the range from 10 torr to 3000 torr. The He flow rate may be in the range from 50 torr to 5000 torr.

In other embodiments, 3MS may be replaced by other molecules of the alkylsilane type, for example tetramethylsilane (4MS), dimethylsilacyclopentane (DMSCP), or disilacyclobutane. Any alkylsilane molecule of the general composition SiCH may be used within the invention.

RF power at 13.6 MHz frequency is applied at a power of 640 W to produce a plasma and to deposit or form on the substrate a first region of dielectric with SiCN or SiCNH composition. The deposition rate is approximately 2.1 nm/second, although other deposition rates may be used. Using continuous plasma, the $NH_3$ flow rate is switched to zero and concurrently the $N_2O$ flow rate is turned on to a flow of 300 sccm. The RF power is changed to 300 W. In alternate embodiments, the RF power may be constant and not changed. This step deposits on the substrate a second component of SiCOH dielectric, that has a random three dimensional network continuous with the first SiCN or SiCNH component.

As is known in the art, the flow rates, RF power and other process parameters may be adjusted within the invention. $N_2O$ may be replaced by $O_2$, $CO_2$ or another oxidizer.

Second Method Embodiment

In this example, a preliminary network is deposited by PECVD, and then a treatment step is used to create porosity and reduce the k value of the network.

In this example, an inorganic random three dimensional covalently bonded network is deposited on a substrate using a stepwise process. The substrate may be a Si wafer containing transistors, wiring and other electronic structures. The substrate in this example is a 300 mm Si wafer and is placed in a reactor (PECVD tool) and the precursor flows are stabilized to reach a desired reactor pressure that may be from 0.1 to 100 torr, for example 5 torr. The wafer chuck temperature is typically set to 350° C., but this temperature may be between 100-450° C. The starting precursors are trimethylsilane (3MS), ammonia ($NH_3$) and a diluent gas such as He. Other diluent gases such as $N_2$, Ar, and the like may be used. In other embodiments, 3MS may be replaced by other molecules of the alkylsilane type, for example tetramethylsilane (4MS), dimethylsilacyclopentane (DMSCP), or disilacyclobutane. Any alkylsilane molecule of the general composition SiCH-.may be used within the invention. The abbreviation sccm is used to mean standard cubic centimeters per minute, common units of mass flow. In this example, the 3MS flow rate is 300 sccm, the $NH_3$ flow rate is 1200 sccm, the He flow rate is 1200 sccm.

The abbreviation mgm is used to mean milligrams per minute, common units of liquid mass flow. RF power at 13.6 MHz frequency is applied at a power of 640 W to produce a plasma and to deposit on the substrate a first component of dielectric with SiCN or SiCNH composition. The deposition rate is approximately 2.1 nm/second, and the SiCN or SiCNH region is deposited in about 5-20 seconds. Using a continuous plasma, the $NH_3$ flow rate is switched to zero and concurrently the $N_2O$ gas is turned on to a flow of 300 sccm, and a bicycloheptadiene (BCHD) precursor flow is turned on to a flow rate of about 1000 mgm. The BCHD is used as a porogen to create porosity. The RF power is changed to 300 W. This step deposits on the substrate a second component of dielectric, porous SiCOH, that has a random three dimensional network continuous with the first SiCN or SiCNH component.

As is known in the art, each of the above process parameters may be adjusted within the invention. The time of deposition of each region of the dielectric may be adjusted. Also within the invention, the vapor of other hydrocarbon liquids or gases may be used in place of BCHD, for example hexadiene, ethylene ($C_2H_4$), propylene, or any other hydrocarbon. As is known in the art, gases such as $CO_2$ may be added, and He may be replaced by gases such as Ar, or another noble gas. $N_2O$ may be replaced by $O_2$ or another oxidizer.

After deposition, the dielectric is treated in a UV cure tool with the substrate temperature of 400° C. for a time of 1 to 20 minutes to create porosity in the network, to reduce the k value, and to modify the Si based network skeleton. In this example, the k value of the second component is from 2.0 to 2.5. As is known in the art, the wafer chuck temperature may be between 100° -500° C. for the UV cure step, while about 350-400° C. is preferred. In alternate embodiments, the treatment may be a thermal treatment, for example at 430° C., or other radiation such as electron beam radiation may be used.

Third Method Embodiment

In this example, a preliminary network is deposited by PECVD, and then a treatment step is used to create porosity and reduce the k value of the network.

In this example, an inorganic random three dimensional covalently bonded network is deposited on a substrate using a stepwise process. The substrate may be a Si wafer containing transistors, wiring and other electronic structures. The substrate in this example is a 300 mm Si wafer and is placed in a reactor (PECVD tool) and the precursor flows are stabilized to reach a desired reactor pressure that may be from 0.1 to 100 torr, for example 5 torr. The wafer chuck temperature is typically set to 350° C., but this temperature may be between 100-450° C. The starting precursors are dimethylsilacyclopentane (DMSCP), ammonia ($NH_3$) and a diluent gas such as He. Other diluent gases such as $N_2$, Ar, and the like may be used. The abbreviation sccm is used to mean standard cubic centimeters per minute, common units of mass flow. In this example, the DMSCP flow rate is 200 sccm, the $NH_3$ flow rate is 1200 sccm, the He flow rate is 1200 sccm.

RF power at 13.6 MHz frequency is applied at a power of 450 W to produce a plasma and to deposit on the substrate a first component of dielectric with SiCN or SiCNH composition. The deposition rate is approximately 3 nm/second, and the SiCN or SiCNH region is deposited in about 5-15 seconds. Using a continuous plasma, a bicycloheptadiene (BCHD) precursor flow is turned on to a flow rate of about 1000 mgm. The BCHD is used as a porogen to create porosity in SiCN or SiCNH film with lower dielectric constant. The RF power is changed to 300 W. This step deposits on the substrate a second component of porous SiCOH dielectric that has a random 3 dimensional network continuous with the first SiCN or SiCNH component.

As is known in the art, each of the above process parameters may be adjusted. The time of deposition of each component of the dielectric may be adjusted. Also, the vapor of other hydrocarbon liquids or gases may be used in place of BCHD, for example hexadiene or any other hydrocarbon.

After deposition, the dielectric is treated in a UV cure tool with the substrate temperature of 400° C. for a time of 1 to 10 minutes to create porosity in the network, to reduce the k value, and to modify the Si based network. In this example, the k value of the second region is from 2.0 to 2.4. In alternate embodiments, the treatment may be a thermal treatment, for example at 430° C., or other radiation such as electron beam radiation maybe used.

As is known in the art, the wafer temperature may be between 100° C.-500° C. for the treatment. As is known in the art, gases such as $N_2$ may be added, and He may be replaced by gases such as Ar, or another noble gas. Instead of forming porous SiCNH using $NH_3$, other oxygen containing precursors such as $N_2O$, $O_2$, $CO_2$ or another oxidizer can be used to form p-SiCOH on top of SiCN or SiCNH While there has been described and illustrated a method for forming a dielectric layer in-situ under a continuous plasma having a first component to provide a diffusion barrier to Cu and other metals and a second component to provide a low k or ultra low k ILD dielectric, it will be apparent to those skilled in the art that modifications and variations are possible without deviating from the broad scope of the invention which shall be limited solely by the scope of the claims appended hereto.

What is claimed is:

1. A dielectric structure comprising:
   a first component comprising at least one of SiCN, SiCNH, SiN, SiNH, BN, BNH, CBN, CBNH, BSiN, BSiNH, SiCBN and SiCBNH and a second component separated from said first component by a transition region wherein said second component has a dielectric constant less than 3.2, said a transition region in contact with said first and second components and comprises substantially one or more atoms of Si, C, N, O and H wherein the concentration of C decreases and O increases in said transition as a function of distance from said first component to said second component.

2. The dielectric structure of claim 1 wherein said first component comprises at least one multilayer of SiN/SiCN, BN/CBN and SiN/BN-CBN.

3. The dielectric structure of claim 1 wherein said second component comprises a porous component.

4. The dielectric structure of claim 1 wherein said second component comprises at least one of SiCOH, p-SiCOH, p-SiCNH, p-BN, p-BNH, p-CBN and p-CBNH.

5. The dielectric structure of claim 1 wherein said first component comprises a random three dimensional covalently bonded network.

6. The dielectric structure of claim 1 wherein said second component comprises a random three dimensional covalently bonded network.

7. An interconnect structure comprising at least one wiring level in an integrated circuit chip having conductors in said wiring level and a dielectric comprising a first component of at least one of SiCN, SiCNH, SiN, SiNH, BN, BNH, CBN, CBNH, BSiN, BSiNH, SiCBN and SiCBNH and a second component separated from said first component by a transition region, said transition region in contact with said first and second components and comprises substantially one or more atoms of Si, C, N, O and H wherein the concentration of C decreases and O increases in said transition as a function of distance from said first component to said second component, said second component comprising at least one of SiCOH, p-SiCOH, p-SiCNH, p-BN, p-BNH, p-CBN and p-CBNH.

8. The interconnect structure of claim 7 wherein said first component comprises at least one multilayer of SiN/SiCN, BN/CBN and SiN/BN-CBN.

9. The interconnect structure of claim 7 wherein said first component, transition region and second component have one continuous random three dimensional network spanning said first component, transition region and second component.

10. The interconnect structure of claim 7 wherein said first component comprises a random three dimensional covalently bonded network.

11. An interconnect structure comprising at least one wiring level in an integrated circuit chip having conductors in said wiring level and a dielectric comprising a first component of a least one of one of SiCN, SiCNH, CBN, CBNH, SiCBN and SiCBNH and a second component adjacent said first component, said second component comprising at least one of SiCOH, p-SiCOH, p-SiCNH, p-BN, p-BNH, p-CBN and p-CBNH, wherein said first and second components are separated by a transition region in contact with said first and second components, wherein said transition region comprises substantially one or more atoms of Si, C, N, O and H and wherein the concentration of C decreases and O increases in said transition as a function of distance from said first component to said second component.

12. An interconnect structure comprising at least one wiring level in an integrated circuit chip having conductors in said wiring level and a dielectric comprising a first component of at least one of SiCN, SiCNH, SiN, SiNH, BN, BNH, CBN, CBNH, BSiN, BSiNH, SiCBN and SiCBNH and a second component adjacent said first component, said second component comprising at least one of SiCOH, p-SiCOH, p-SiCNH, p-BN, p-BNH, p-CBN and p-CBNH, wherein said first and second components are separated by a transition region in contact with said first and second components, wherein said transition region comprises substantially one or more atoms of Si, C, N, O and H and wherein the concentration of N decreases and O increases in said transition region as a function of distance from said first component to said second component.

13. The interconnect structure of claim 12 wherein said first component comprises at least one of SiCN, SiCNH, CBN, CBNH, SiCBN and SiCBNH and wherein the concentration of C decreases in said transition region as a function of distance from said first component to said second component.

14. The interconnect structure of claim 12 wherein said first component, transition region, and second component have one continuous random three dimensional network spanning said first component, transition region and second component.

15. A dielectric structure comprising:
    a first component of at least one of SiCN, SiCNH, SiN, SiNH, BN, BNH, CBN, CBNH, BSiN, BSiNH, SiCBN and SiCBNH and a second component separated from said first component by a transition region wherein said second component has a dielectric constant less than 3.2, said transition region in contact with said first and second components and comprises substantially one or more atoms of Si, C, N, O and H and wherein the concentration of N decreases and O increases in said transition region as a function of distance from said first component to said second component.

16. The interconnect structure of claim 15 wherein said first component comprises at least one of SiCN, SiCNH, CBN, CBNH, SiCBN and SiCBNH and wherein the concentration of C decreases in said transition region as a function of distance from said first component to said second component.

* * * * *